(12) United States Patent
Godol et al.

(10) Patent No.: US 8,480,346 B2
(45) Date of Patent: Jul. 9, 2013

(54) APPARATUS FOR LOADING AND UNLOADING SEMICONDUCTOR SUBSTRATE PLATELETS

(75) Inventors: Erwan Godol, Aix les Bains (FR); Emmanuelle Veran, Annecy (FR)

(73) Assignee: Alcatel-Lucent, Paris (FR)

( * ) Notice: Subject to any disclaimer, the term of this patent is extended or adjusted under 35 U.S.C. 154(b) by 899 days.

(21) Appl. No.: 12/459,716

(22) Filed: Jul. 7, 2009

(65) Prior Publication Data
US 2010/0008748 A1    Jan. 14, 2010

(30) Foreign Application Priority Data

Jul. 11, 2008 (FR) ..................................... 08 54753

(51) Int. Cl.
*B65G 49/07* (2006.01)
(52) U.S. Cl.
USPC .................... 414/217; 414/217.1; 414/331.14; 414/797.5; 414/939
(58) Field of Classification Search
USPC .................... 414/217, 217.1, 331.14, 331.18, 414/791.9, 797.5, 939
See application file for complete search history.

(56) References Cited

U.S. PATENT DOCUMENTS

| | | | | |
|---|---|---|---|---|
| 3,858,732 A * | 1/1975 | Kemper | ...................... | 414/797.5 |
| 4,162,649 A * | 7/1979 | Thornton | ................... | 414/790.8 |
| 4,983,097 A * | 1/1991 | Ema et al. | ................... | 414/795.2 |
| 6,062,798 A * | 5/2000 | Muka | ........................ | 414/416.03 |
| 6,619,903 B2 * | 9/2003 | Friedman et al. | ........... | 414/331.14 |
| 6,962,471 B2 * | 11/2005 | Birkner et al. | ................ | 414/217 |
| 7,014,415 B2 * | 3/2006 | Yoshizawa | ................. | 414/797.5 |
| 7,581,916 B2 * | 9/2009 | Miller | ........................... | 414/217 |
| 8,033,772 B2 * | 10/2011 | Kurita et al. | ............ | 414/222.07 |
| 2003/0002964 A1 * | 1/2003 | Hee et al. | ................. | 414/331.18 |
| 2004/0062627 A1 * | 4/2004 | Aggarwal et al. | ............ | 414/217 |
| 2005/0186716 A1 | 8/2005 | Kasumi | | |
| 2009/0196714 A1 * | 8/2009 | Sylvestre et al. | ......... | 414/217.1 |

FOREIGN PATENT DOCUMENTS

| | | |
|---|---|---|
| EP | 1457829 | 9/2004 |
| JP | 11087459 | 3/1999 |
| WO | 2007141447 | 12/2007 |

* cited by examiner

*Primary Examiner* — James Keenan
(74) *Attorney, Agent, or Firm* — Carmen Patti Law Group, LLC

(57) ABSTRACT

The goal of the present invention is to provide an apparatus capable of cooperation with at least one piece of wafer processing equipment. The apparatus is connected to a first equipment via a first opening, to a wafer transport case via a second opening and to a second piece of equipment via a third opening. The apparatus is capable of removing a basket of parallel stacked trays of wafers from a wafer transport case. The apparatus is capable of placing and supporting the wafers in order to move them to the first equipment through the second opening and to the second piece of equipment through the third opening.

9 Claims, 5 Drawing Sheets

APPARATUS FOR LOADING AND UNLOADING SEMICONDUCTOR SUBSTRATE PLATELETS

REFERENCE

This application is based on and claims the benefit of French patent application No. 08/54,753, filed Jul. 11, 2008, which is incorporated herein by reference.

TECHNICAL FIELD

The present invention concerns the area of transport, storage and transfer of semiconductor substrate platelets (wafers), in particular between the different stages of manufacture of the microelectronic components, e.g. for the creation of Micro-Electro-Mechanical Systems (MEMS) or of Micro-Opto-Electro-Mechanical Systems (MOEMS). The invention more particularly concerns an apparatus for loading and unloading such substrates, capable of being coupled to a system devoted to the manufacture and processing of such substrates.

BACKGROUND

In the devices currently in use, between the different manufacturing stages the substrates are transported and stored at atmospheric pressure in the transport cases that protect them from particular pollution present in the atmosphere of clean rooms. A transport case comprises a leak proof peripheral wall with an entry-exit opening capable of being closed by a casing door fitted with leak prevention means. The substrates take, in particular, the form of square masks or of circular shape slices in a semi-conductor material such as silicon. In a transport case, the substrates are stacked close to one another in a kind of rack also referred to as cassettes or baskets.

Currently, a first type of transport case is used, designated by the acronym SMIF (for "Standardized Mechanical Interface"). These transport cases comprise a bell shaped casing body resting on a base plate that closes their bottom opening, constituting a door. The basket is generally set or held on the base plate. The substrates are stacked horizontally in the basket.

A second type of transport case is used, designated by the acronym FOUP (for "Front Opening Unified Pod") is also used, which comprises a lateral opening casing body.

The transport cases must be capable of being connected with entry/exit interfaces of semiconductor component manufacturing or substrate processing facilities. The transport cases are coupled with the equipment via means ensuring permanent air tightness in regard to the external atmosphere in the clean room.

The interface is a system enabling positioning of the transport case, opening of its case door, and the grasping and transport of the substrate for transfer between the transport case and the equipment. The said interface, sometimes also called mini-environment, shall hereafter be referred to by the term "frontal equipment module", or, simply module, and by the acronym EFEM (for Equipment Front End Module).

Under atmospheric pressure, the EFEM module comprises robotic means to transport each substrate from the transport to a loading and unloading chamber (designated by the term "load lock") that communicates with a transfer chamber preceding a process chamber. During the loading process, the substrates are transferred from the transport case to the lock under atmospheric pressure. The loading lock is then subjected to very low pressure. Then the transfer chamber robot transports the substrate from the load lock to the vacuum processing chamber, where processing takes place. When processing is completed, the reverse operation—unloading of the substrate from the processing chamber to the transport case—requires bringing the load lock back to atmospheric pressure before transfer of the substrate with the help of robotic means to the EFEM module and the transport case.

These gas pressure variations require pumping and re-pressurizing to atmospheric pressure operations that cause gas flows likely to generate particulate contaminations of the loading lock and therefore of the substrates. It is therefor particularly necessary to limit possible contaminations, so as to increase the productivity of semiconductor manufacturing facilities. Best efforts are therefore devoted to minimizing oxidation and corrosion phenomena affecting the substrates during the processing phases, the waiting phases in the transport case between two steps of the process, or the transfer phases from one semiconductor processing equipment to another.

One solution is to implement purging solutions at the end of the processing, but for certain new technologies the oxidation or corrosion phenomena take place even before the end of the processing of complete lots of substrates. This forces manufacturers to divide the lots and to process each portion successively, which leads to an increase in the total lot processing time.

Another solution consists in reducing the waiting phases between two steps of the process, but this requires increasing the quantity of equipment and raises cost issues.

SUMMARY

However, the disadvantage of the system comprising an EFEM module associated to a transport case is its inability to couple simultaneously to both pieces of equipment, so as to enable a direct transfer of the substrates from one piece of equipment to another, as is the case for example for the transport case described in document WO-2007/141447.

Equipment is supposed to mean any structure intended to be connected to a transport case for substrate transfers. Equipment of this kind can for example be an EFEM module, a loading/unloading lock or a transfer chamber.

The present invention is therefore intended to reduce the number of wafer transfer operations in the course of their processing, by authorizing simultaneous connection of the transport cases to several pieces of equipment so as to enable direct transfer of the wafers from one piece of equipment to another without disconnection or extraction from the transport case.

Another goal of the invention is to offer a transport case comprising means to facilitate such transfers.

The invention further has the purpose of supplying an apparatus capable of cooperation with the equipment currently existing in semiconductor component manufacturing facilities.

The goal of the present invention is an apparatus that is capable of cooperation with at least one piece of substrate processing equipment, comprising a leak proof wall comprising, in turn, a first opening comprising means for the connection to a first piece of equipment chosen from between a transfer chamber and a processing chamber, a second opening comprising means of connection to a wafer transport case containing a basket, comprising a series of parallel stacked trays adapted to store a wafer each, the basket being susceptible of being transported within the apparatus, means for moving the basket from and to the transport case,
means for immobilizing the trays,
characterized in that it further comprises
- a third opening comprising means for the connection to a second piece of equipment chosen from between an EFEM module and a transfer chamber, and
- means for transferring wafers to the equipment, ensuring both the placement and support of a wafer and the function of a means of movement of the wafer to enable its passage through the second opening and/or the third opening.

The present invention thus proposes an apparatus capable of simultaneous connection to several pieces of equipment. The apparatus also enables transport of the case connected to it from one processing equipment to another without bringing the wafers back to atmospheric pressure. The apparatus according to the invention shall also hereafter be referred to as a "mobile load lock".

According to a first embodiment of the invention, the apparatus is capable of simultaneous connection to a transfer chamber, to an EFEM atmospheric pressure wafer transfer module and to a transport case, which may be placed under vacuum. In that case, the apparatus may thus be used instead of a traditional loading/unloading lock at semiconductor manufacturing facilities.

According to a second embodiment, the apparatus is capable of simultaneous connection to a first transfer chamber, to a second transfer lock and to a transport case.

According to a third embodiment, the apparatus is capable of simultaneous connection to a processing chamber, to a transfer chamber and to a transport case.

According to a fourth embodiment, the apparatus is capable of simultaneous connection to a processing chamber, to an EFEM module and to a transport case.

According to a first variant of the invention, the apparatus further comprises door activating means to open and close the doors respectively blocking each opening. The apparatus may also comprise means to consolidate the door of the transport case with the door of the third opening through mechanical or magnetic means. The activating means for the door closing the third opening can also fulfil the function of basket displacement means.

According to a second variant, the apparatus also comprises air tightness means in the area where an opening is coupled to a piece of equipment.

According to a third variant, the apparatus may also comprise ramming means capable of applying an axial pressure on the door of the transport case in order to compress the leak proof means. The ramming means shall preferably be placed on the outside of the leak proof wall of the apparatus in order to minimize the risk of wafer contamination.

According to one embodiment of the invention, the means for immobilizing the trays comprise locking pins acting together with means for activating the said pins. Preferably, such locking pins shall be fitted with a notch engaging with the tray.

According to another embodiment, the means for wafer placement and support comprise placement arms acting together with means for activating the said arms.

Advantageously, such activating means shall be atmospheric pressure actuators.

According to yet another embodiment, the means for wafer placement and support comprise wedges, by means of which the wafer rests on the tray.

Advantageously, the means for wafer placement and support comprise the combination of placement arms, acting together with means for activating the said arms, and of wedges arranged between the tray and the wafer. The wedges enable the wafers to be removed from the tray and manage a gap into which the placement arms are inserted.

The wafer placement means shall preferably be motorized scoops included in the pieces of equipment to which the apparatus according to the invention is connected.

To transfer the wafers from a SMIF type transport case to a piece of equipment, the transport case is placed on the apparatus according to the invention. The internal door of the case is opened and the basket and all wafers contained in it are lowered until they reach the inside volume of the apparatus. The trays are then separated into two groups thanks to the immobilizing means so as to enable the support means to advance to position themselves under a wafer while the tray that supported it continues its descent. When the two tray groups are sufficiently separated from each other, the grasping of a selected wafer and its removal away from its support can be carried out by robotic means. The wafers are thus removed one at a time by a robotic scoop to be introduced into either of the connected pieces of equipment.

An advantage of the invention is to enable loading of the transport case both under atmospheric pressure and under vacuum. The apparatus according to the invention makes it possible to load a great number of wafers under vacuum, thus avoiding pumping and repressurizing to atmospheric pressure for each wafer, therefore significantly reducing the risk of pollution. The transfer is carried out entirely under vacuum, so that there are no oxidation issues.

Another goal of the invention is to provide a system for wafer processing comprising a processing chamber communicating with a first transfer chamber, and at least one apparatus such as previously described, communicating with the first transfer lock, with an EFEM module or a second transfer lock, and with a transport case.

According to a first embodiment of the invention, the system comprises at least one apparatus such as previously described, communicating with the first transfer chamber, with an EFEM module or a second transfer lock, and with a transport case.

According to a second embodiment of the invention, the system comprises at least one apparatus such as previously described, communicating with a first transfer chamber, with a second transfer lock, and with a transport case.

Yet another goal of the invention is to provide a system for wafer processing comprising a processing chamber and at least one apparatus such as previously described, communicating with the processing chamber, with an EFEM module or a transfer chamber, and with a transport case.

According to a third embodiment of the invention, the system comprises at least one apparatus such as previously described, communicating with a processing chamber, with a transfer chamber, and with a transport case.

According to a fourth embodiment of the invention, the system comprises at least one apparatus such as previously described, communicating with a processing chamber, with an EFEM module, and with a transport case.

According to a first aspect, the system according to the invention may be used for intermediate storage of wafers without disconnecting from the system apparatus.

According to a second aspect, the system according to the invention may be used to classify a method.

According to a third aspect, the system according to the invention may be used to sort a wafer batch or a mix of wafers from different batches.

The apparatus according to the invention enables performance of numerous wafer transfer and handling applications to be explained in greater detail below, in particular wafer sorting, vacuum storage without releasing from the system comprising the processing chamber, processing equipment classification or decontamination of processing equipment without contaminating other wafers. By means of the invention, maintenance operations may be carried out without stopping the processing system, which represents economies of time and cost for semiconductor component manufacturers.

Furthermore, this solution is compatible with existing systems, so that it is not necessary to make significant changes to the system.

BRIEF DESCRIPTION OF THE DRAWINGS

Other characteristics and advantages of the present invention will become apparent upon reading the following description of one embodiment, which is naturally given by way of a non-limiting example, and in the attached drawing, in which.

DETAILED DESCRIPTION

Figure 1:
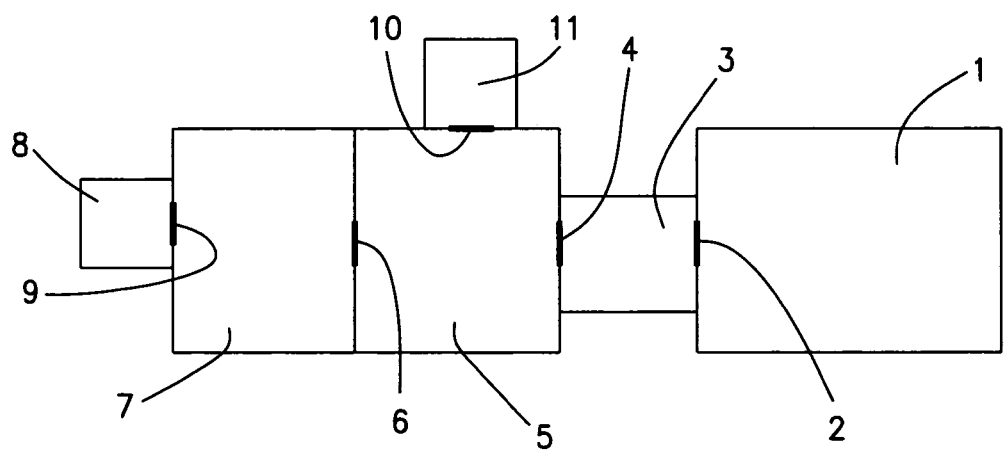
FIG. 1 schematically represents a wafer processing system according to the first embodiment of the invention.

FIG. 1 shows a wafer processing system according to the first embodiment of the present invention, it comprises a processing chamber 1, kept under vacuum and in which are carried out the wafer manufacturing or processing operations, in particular as concerns semiconductor wafers. Via an opening 2, the processing chamber 1 communicates with a transfer chamber 3, also kept under vacuum, and into which the wafer is placed immediately before and after processing in the processing chamber 1. Via an opening 4, the transfer chamber 3 communicates with a loading/unloading lock 5 in which the phases of placing under vacuum and repressurization to atmospheric pressure take place alternately. The said lock 5 may enable, via an opening 6, connection of the transfer chamber 3 with an EFEM module 7 in which the wafers are kept at atmospheric pressure and to which one or several transport cases 8, of FOUP type for example, can be connected via an opening 9. The wafers may thus be transferred, one by one, from the transfer chamber 3 to the EFEM module 7 via the lock 5. The wafers may then be placed in removable transport cases 8 used for the storage or transport of wafers at atmospheric pressure, in particular between two manufacturing phases or between two different pieces of processing equipment.

According to this embodiment of the invention, the loading/unloading lock MLL 5 additionally communicates via an opening 10 with a transport case 11, as for example a SMIF type case. Because it is removable, the said mobile MLL loading/unloading lock 5 enables the transport case 11 to be decoupled from the equipment, thus enabling transport of the case containing the wafers under vacuum to another piece of processing equipment. Preferably, the walls of the mobile loading/unloading lock 5 and of the transport case 11 shall be made of metal so as to be able to support, endure and maintain vacuum.

Figure 2:
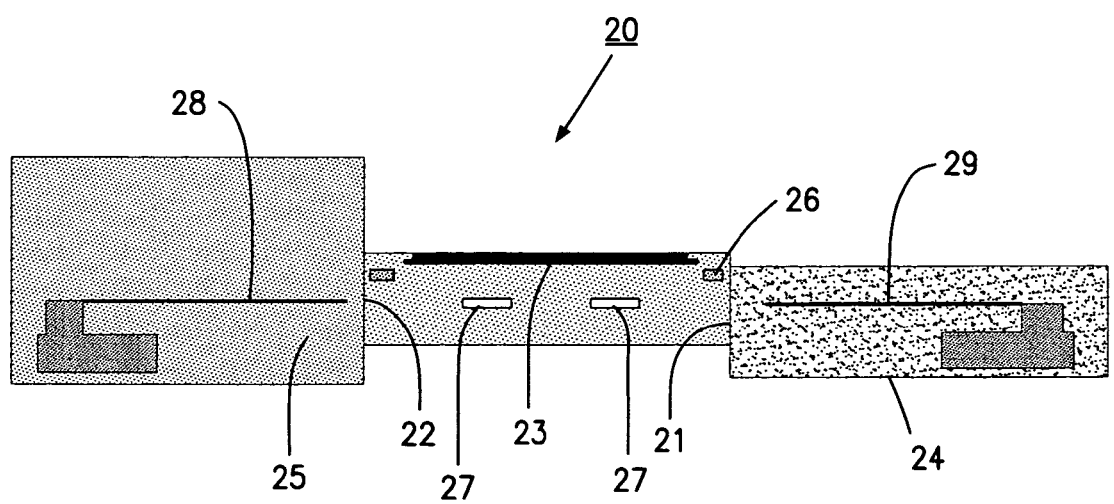
FIG. 2 is a schematic side view of the apparatus according to one embodiment of the invention.
Figure 3:
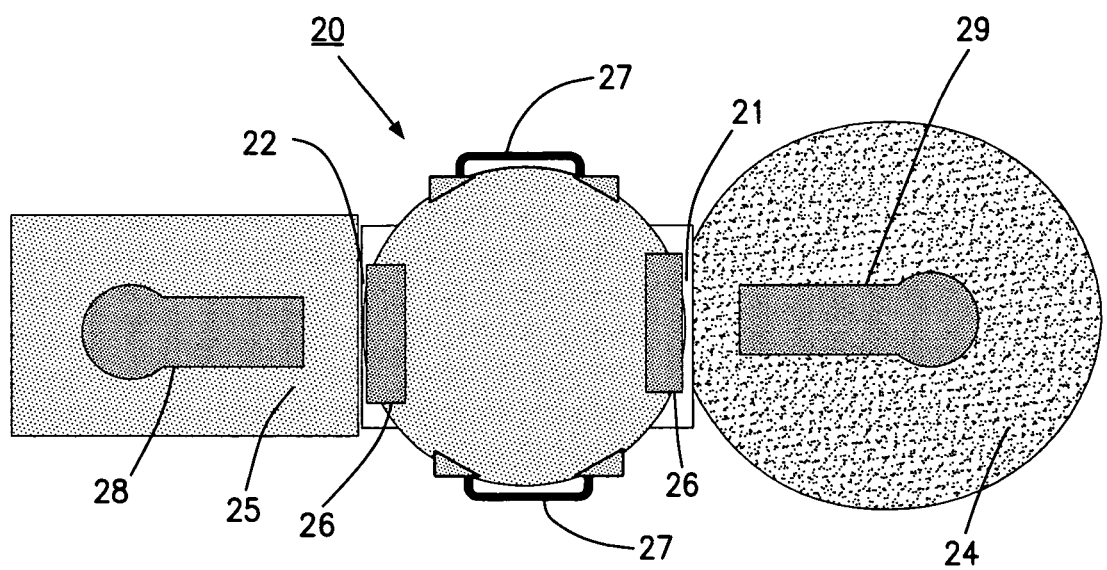
FIG. 3 is a schematic top view of the apparatus of FIG. 2.

An embodiment of an apparatus 20 according to the invention is represented in FIGS. 2 and 3. The mobile loading/unloading lock 20 comprises three access openings 21, 22 and 23. The lock MLL 20 is, for example, connected to the transfer chamber 24 of a system by the opening 21 and to an EFEM module 25 by the opening 22, with openings 21 and 22 being arranged in one of the lateral walls. It is also connected to a transport case (not shown) via its opening 23 arranged in a lower, or, preferably, upper wall of the apparatus 20.

The lock MLL 20 is designed to receive the basket containing the wafers contained in the transport case, and to ensure removal of the wafers to the various pieces of equipment. With this goal, the lock MLL 20 comprises means 26 to immobilize some of the trays of the basket in a set position, leaving the other trays free to pursue their movement. It also comprises means 27 to place and support the selected wafer while the tray on which the latter was previously set continues its descent. Finally, it acts together with the robotic means 28 of the EFEM module 25 and the robotic means 29 of the transfer chamber 24 to remove the wafers to the said pieces of equipment via the openings 21 and 23.

Figure 4:
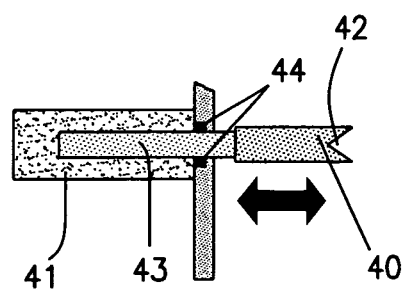
FIG. 4 is a schematic side view of one embodiment of the tray immobilization means.

The means for the immobilization of the trays may, for example, be motorized locking pins 40 as illustrated in FIG. 4, adapted for selective blocking of the downward motion of a selected tray, thus preventing the said tray and those above it from descending further into the interior of the mobile loading/unloading lock MLL. In this example, there are two of the said locking pins 40. They are activated by atmospheric pressure actuators or pneumatic cylinders 41, which cause them to move on the horizontal plane towards or away from the trays. The end of each locking pin 40 comprises a notch 42 that engages with the tray thus enabling it to be supported. The atmospheric pressure actuators 41 are situated outside the mobile loading/unloading lock MLL so as to prevent particulate contamination. Leak proof passages 43 provide the connection between the locking pins and the actuators. Leak proof means 44, positioned in the area of contact between the leak proof passage 43, the actuators 41 and the lock insulate the inside of the lock from the outside atmosphere.

Figure 5:
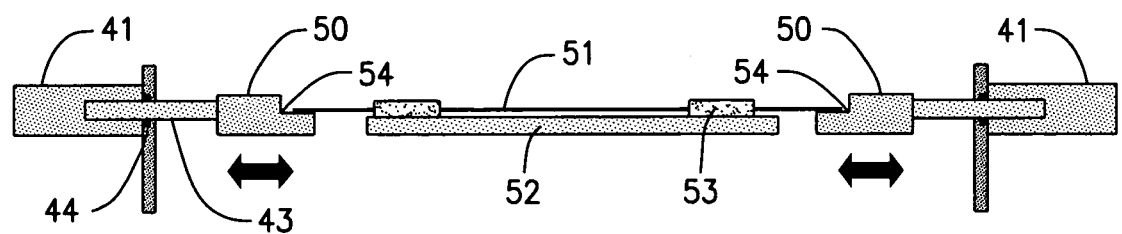
FIG. 5 is a schematic side view of one embodiment of the means of support for a wafer.
Figure 6:
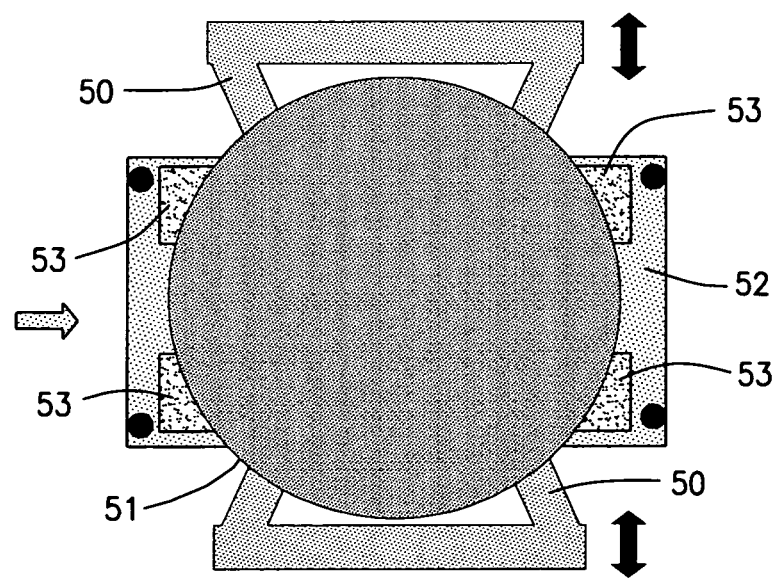
FIG. 6 is a schematic top view of the means of support for a wafer from FIG. 5, FIGS. 7a to 7d show the successive steps involved in the unloading of a wafer by means of the apparatus according to one embodiment of the invention, FIG. 8 schematically represents a wafer processing system according to the second embodiment of the invention, FIG. 9 schematically represents a wafer processing system according to a special embodiment of the invention, On the Figures, the arrows indicate the direction in which the parts are moved.

The means for the placement and support of the wafers comprise, for example, moveable placement arms 50 as represented in FIGS. 5 and 6. In this case, the mobile loading/unloading lock MLL comprises two placement arms 50 that slide under a wafer 51 and support it during the downward movement of the tray 52. The means for wafer placement and support also comprise wedges 53, by means of which the wafer rests on the tray, and which enable passage of the arms. It is therefore understood that, at rest, the placement arms 50 are in a withdrawn position in the mobile loading/unloading lock so as to allow a passage for the basket. The placement arm 50 comprises a stop 54 enabling to ensure lateral support for the wafer.

In the mobile loading/unloading lock MLL, the placement arms 50 are positioned facing each other, preferably at a height corresponding to the center of the passage openings 21 or 23 of FIG. 2, respectively on the two walls that are perpendicular to those in which are located the openings 21, 23.

According to an advantageous embodiment, in order to avoid particulate contamination of the wafers, the portion of the arms that is intended to come into contact with the wafer is implemented in a material that prevents particulate contamination, such as polyether ether ketone (PEEK) or else a tetrafluoroethylene and perfluoroethylene or perfluoroalkoxy alcane (PFA) copolymer.

The steps of unloading a wafer from a transport case 70 to a transfer chamber by means of an MLL 71 apparatus according to an embodiment of the present invention have been represented in the embodiment of the invention illustrated in FIGS. 7a to 7d. The lock MLL 71 is connected to the transport case 70 by its upper opening 72. It is also connected for example to the transfer chamber of a piece of equipment via an opening 73 and to an EFEM module via an opening 74.

The transport case 70 here represented is a SMIF type case comprising a lower opening capable of being closed by a door 75 equipped with leak proofing such as a gasket 76. The transport case 70 contains a basket 77 in which can be arranged the wafers 78 to be transported. The basket 77 comprises a series of parallel trays 79 adapted to store a wafer 78 each.

The mobile loading/unloading lock 71 according to this embodiment of the invention is designed to receive several wafers 78 simultaneously, then to transfer them one by one and under vacuum within a transfer chamber. From the transport case 70, the basket 77 containing the wafers 78 is transferred into the lock 71 via the opening 72.

For this purpose, the apparatus 71 comprises means for the movement of the basket 77 and of immobilization of the trays 79 in a set position. The means for the immobilization of the trays are, for example, locking pins 80 adapted for selective blocking of the downward motion of a selected tray, thus preventing the said tray and those above it from descending further into the interior of the apparatus 71. The means for wafer placement and support 78 comprise, for example, in combination, wedges 81 that raise the wafers, and placement arms 82 that slide under the wafer 78 and support it during the downward movement of the tray on which it was previously set. The means for the removal of the wafers 78 comprise, for example, a motorized scoop 83 that can raise the wafer 78 resting on the placement arms 82 and remove it towards the EFEM module via the opening 74.

There follows an explanation of the transfer of wafers towards the equipment.

Once the transport case 70 has docked on the opening 72 of the apparatus MLL 71, the connection is leak proofed by means of the gasket 76. The door 75 of the case 70 is unlocked (if it is equipped with locking means). The door 75 of the case 70 and the door 84 of the apparatus MLL 71 are connected by means of a system that may be magnetic or mechanical. When the door 84 of the apparatus 71 is activated, the door 75 of the case 70 descends with the door 84 of the mobile loading/unloading lock MLL 71 as well as the entire set of trays 79 constituting the basket 77.

During the descent of the basket 77, the door of the lock MLL 71 stabilizes in order to enable the locking pins 80 to advance in order to block the descent of the tray located just above it and which carries the wafer 78 to be transferred, thus preventing the continuation of the descent of a first group of trays 79a placed above the locking pins 80. The group of trays 79b located below the locking pins 80 continues its descent up to the moment when the desired wafer 78 is located at a few millimeters above the level of the placement arms 82. The placement arms 82 then move forward, while the second group of trays 79b continues its descent, and the wafer is thus placed on the arms 82.

Figure 7A:
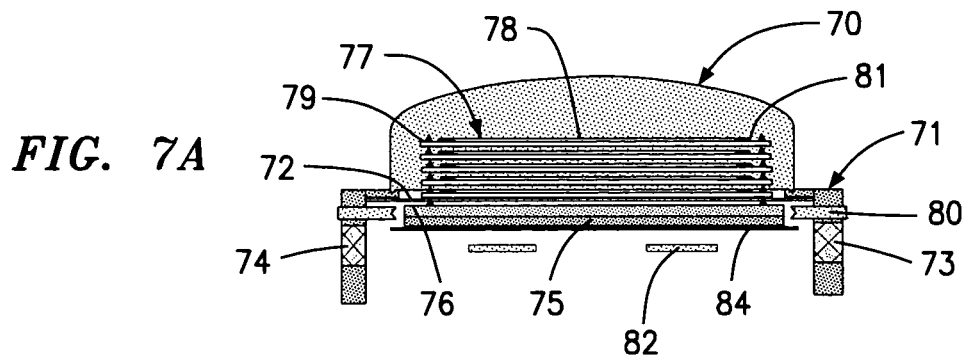
Figure 7B:
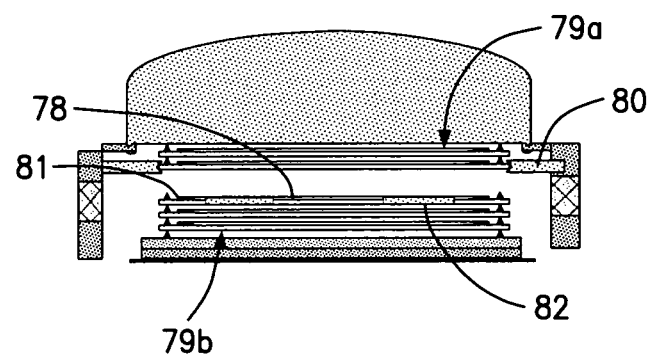
Figure 7C:
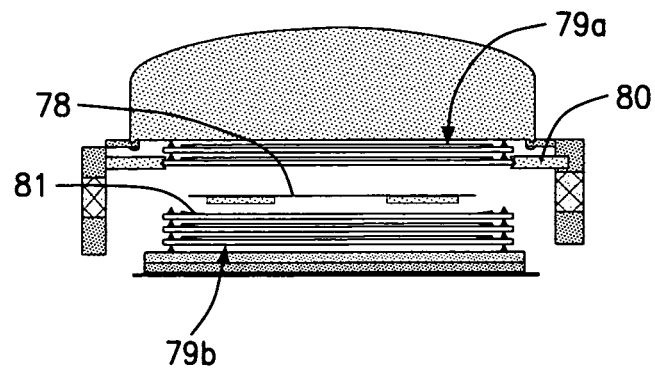
Figure 7D:
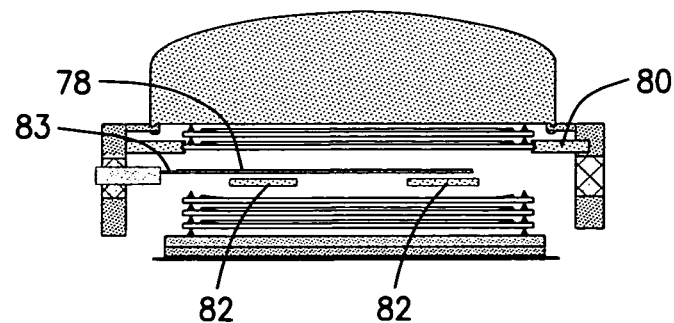

A scoop 83 is introduced between the placement arms 82 to position itself under the wafer 78. Then the said scoop 83 raises the wafer that had been set on the arms 82. The scoop 83 can then move carrying the wafer 78 to take it into the EFEM module via the opening 74. Although FIG. 7d represents the transfer of the wafer 78 into an EFEM module via the opening 74, the transfer of the wafer 78 into the transfer chamber via the opening 73 may of course be carried out symmetrically in the same manner without requiring the basket 77 to be repositioned or a modification of its orientation.

Figure 8:
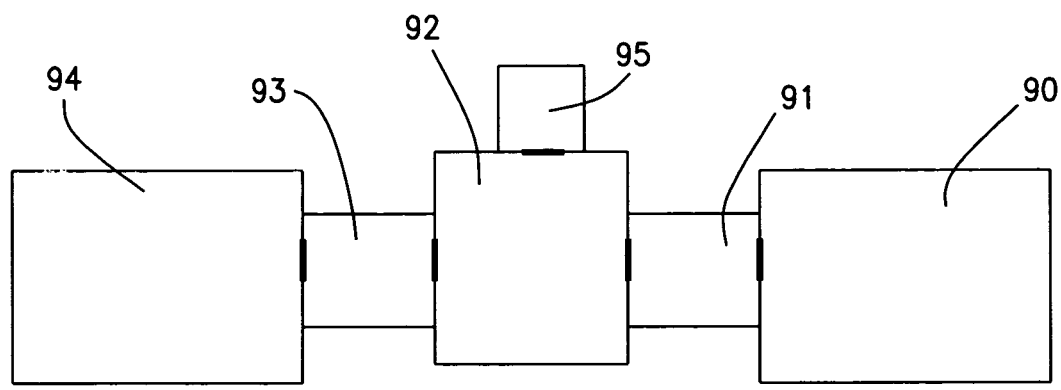

FIG. 8 shows a wafer processing system according to the fourth embodiment of the present invention, it comprises a first processing chamber 90, in which wafers are processed, and which communicates with a first transfer chamber 91, into which the wafer is placed immediately before and after processing in the first processing chamber 90. The transfer chamber 91 communicates with an apparatus MLL 92 which is simultaneously in communication with a second transfer chamber 93, which is in turn linked to a second processing chamber 94 in which further processing of the wafers takes place. The loading/unloading lock MLL 92 additionally communicates with a transport case 95, as for example a SMIF type case. The wafers may thus be transferred, one by one, from the first processing chamber 90 to the second processing chamber 94 via the lock MLL 92. The wafers may be temporarily placed on hold in the transport case 95 before being loaded into either processing chamber.

Figure 9:
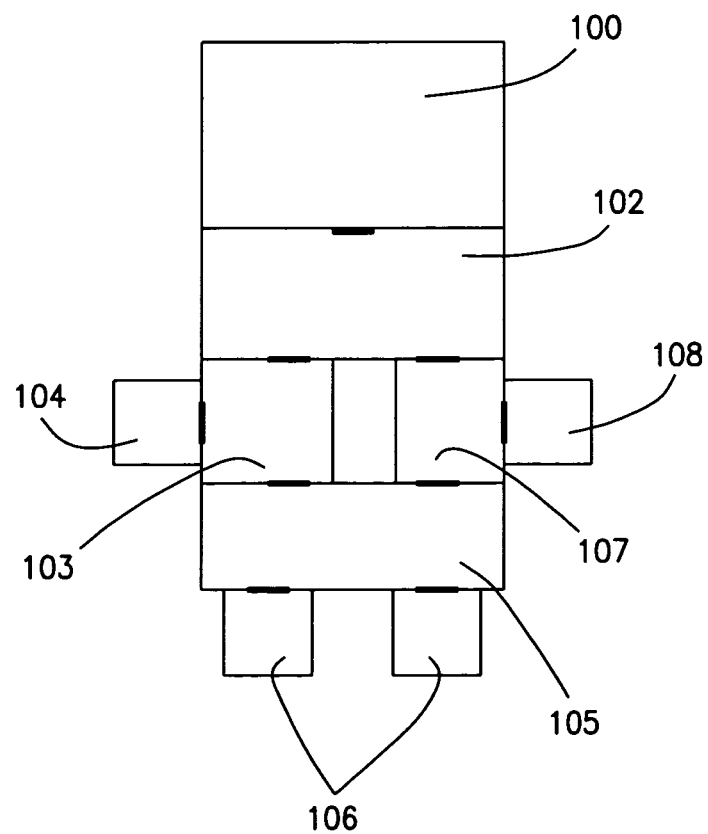

Thus the apparatus according to the invention or mobile loading/unloading lock MLL, associated to a transport case connected to it, can be used in a number of applications involving the handling of wafers. FIG. 9 represents a system adapted to some such applications.

The processing chamber 100 communicates with the transfer chamber 102, which in turn communicates with a first loading/unloading lock 103 connected to a transport case 104. The lock 103 may enable connection with an EFEM module 105, to which one or several transport cases 106 can be connected. The transfer chamber 102 also communicates with a second loading/unloading lock 107, which is in turn connected to a transport case 108, also connected to the EFEM module 105. The option for a simultaneous connection of a second loading/unloading lock to the transfer chamber 102 enables creation of a parallel circuit or processing of an urgent batch, for example of a classification wafer by placing another batch on hold.

A first application of the apparatus according to the invention is the intermediate storage of wafers without disconnecting from the lock 103, 107 of the system comprising the processing chamber 100. Where the processing requires a relatively long time, a complete batch comprising several wafers to be processed must be divided into two parts. Each half-batch is placed, respectively, in a transport case 106, for example of FOUP type, which may simultaneously be connected to the EFEM module 105, which is in turn linked to the mobile loading/unloading dock MLL 103, 107.

The wafers are then transferred, one by one, from the transport case 106 to a basket arranged in a first lock MLL 103 via the EFEM module 105 by means of the scoop of the robot of the EFEM module 105. Then each wafer is transferred from the first lock MLL 103 to the processing chamber 100 to be processed, via the transfer chamber 102 by means of the scoop of the robot of the transfer chamber 102. As soon as processing is completed in the processing chamber 100, the wafer is transferred to a second lock MLL 107 equally connected to the transfer chamber 102, which also enables vacuum storage of the processed wafers without contact with wafers not yet processed and having remained in the first lock MLL 103, thus avoiding any contamination.

A second application is the classification of a process ("hot lot") to enable verification of whether the processing systems have preserved the same specifications, and thus to classify a chain of processing equipments participating in the different steps of a process.

A first transport case 104, connected to a first mobile loading/unloading lock MLL 103 and containing the complete lot of wafers to be processed, is on hold, under vacuum and connected to the equipment. A second transport case 108 containing only a single wafer is connected to a second mobile loading/unloading lock MLL 107. The classification wafer is transferred into the processing chamber 100 to be processed. It is then brought back into the second transport case 108 via the lock MLL 107 to which the transport case 108 is connected. The second transport case 108 is then transported towards another processing system in order to carry out the same sequence of operations just described above, and so on until the wafer has undergone all stages of the process to be classified on all dedicated equipment. At the end of those different stages, the wafer is analyzed; the results of the said analysis enable validation of the processing equipment implemented in the manufacturing chain to carry out the process as well as any processing to be implemented.

A decontamination wafer used in this particular application ("gathering") can be successively transferred into the different processing chambers of a processing system and left for a period of time in each processing chamber. This operation enables decontamination of each chamber. As soon as the wafer has finished circulating through all chambers of the processing system, the transport case 108 is disconnected from the lock MLL 107 to enable recovery of the wafer for analysis or disposal.

Certain processes raise wafer temperature. If the wafer remains hot after processing, it can be left to cool down under vacuum in the lock MLL or in the transport case, which prevents oxidation problems. This is not possible in traditional systems.

The MLL apparatus may also be used to mix or complete a wafer batch contained in the transport case 104, 108 connected to a lock MLL 103, 107 with wafers originating from the transport case 106 communicating with the EFEM module 105. These manipulations are currently carried out by machines called "sorters" or "stockers".

Maintenance of loading/unloading locks MLL 103 is performed with greater ease and without interruption of the manufacturing process. First, the transport case 104 is disconnected from the loading/unloading lock MLL 103. Then the lock MLL 103 is returned to atmospheric pressure. The door of the lock 103 is then opened, providing access to its interior volume to enable maintenance. The facility can continue working with the wafers originating from the transport case 108 via the loading/unloading lock MLL 107. This represents significant time and cost savings for the manufacture of semiconductor component manufacture as compared to the current situation that requires the entire plant to be stopped. Indeed, the transfer chamber and the EFEM module must currently be disconnected from the loading/unloading lock in order to enable access to its interior.

The invention claimed is:

1. Apparatus capable of cooperation with at least one wafer processing equipment, and capable of being placed under vacuum, said apparatus comprising:

a first opening comprising leak proof means for connection to a first equipment chosen from a transfer lock and a wafer processing chamber which are kept under vacuum;

a second opening comprising leak proof means of connection to a wafer transport case containing a basket, comprising a series of parallel stacked trays adapted to store a wafer each, the basket being able to be transported within the apparatus while both the apparatus and the wafer transport case are kept under vacuum;

means for moving the basket from and to the wafer transport case while under vacuum;

means for immobilizing the trays;

a third opening comprising leak proof means for connection to a second piece of equipment chosen from an EFEM module and a second wafer processing chamber; and means for placement and support of a wafer in a given position, capable of working together with the means for moving the basket and the means for immobilizing the trays to enable the passage of the wafer through either the first or the third opening.

2. Apparatus according to claim 1, further comprising door activating means to open and close doors respectively blocking each opening so that the apparatus may be kept under vacuum when the doors are closed.

3. Apparatus according to claim 1, further comprising means for maintaining a vacuum in the apparatus and the first equipment when the first opening is coupled to the first equipment.

4. Apparatus according to claim 1, wherein the means for immobilizing the trays comprise locking pins acting together with means for activating said pins.

5. Apparatus according to claim 4, wherein said locking pins are fitted with a notch engaging with a tray.

6. Apparatus according to claim 1, wherein the means for placement and support of a wafer comprises the combination of placement arms, acting together with means for activating the said arms, and of wedges arranged between a tray and the wafer.

7. Apparatus according to claim 1, further comprising means for maintaining a vacuum in the apparatus when in the area where the second opening is coupled to the wafer transport case.

8. System for wafer processing comprising;

a wafer processing chamber communicating with a first transfer chamber; and an apparatus capable of cooperation with at least one wafer processing equipment, and capable of being placed under vacuum, said apparatus comprising:

a first opening comprising leak proof means for connection to a first equipment chosen from a transfer lock and the wafer processing chamber which are kept under vacuum;

a second opening comprising leak proof means of connection to a wafer transport case containing a basket, comprising a series of parallel stacked trays adapted to store a wafer each, the basket being able to be transported within the apparatus while both the apparatus and the wafer transport case are kept under vacuum;

means for moving the basket from and to the wafer transport case while under vacuum;

means for immobilizing the trays;

a third opening comprising leak proof means for connection to a second piece of equipment chosen from an EFEM module and a second wafer processing chamber; and means for placement and support of a wafer in a given position, capable of working together with the means for moving the basket and the means for immobilizing the trays to enable the passage of the wafer through either the first or the third opening; said apparatus communicating with the first transfer chamber, with the EFEM module or the second transfer chamber, and with the wafer transport case.

9. System for wafer processing according to claim 8, further comprising:

a second apparatus capable of cooperation with at least one wafer processing equipment connected between the first transfer chamber and the EFEM.

* * * * *